United States Patent
O'Brien et al.

(10) Patent No.: US 12,278,289 B2
(45) Date of Patent: *Apr. 15, 2025

(54) TMD INVERTED NANOWIRE INTEGRATION

(71) Applicant: Intel Corporation, Santa Clara, CA (US)

(72) Inventors: Kevin P. O'Brien, Portland, OR (US); Carl Naylor, Portland, OR (US); Chelsey Dorow, Portland, OR (US); Kirby Maxey, Hillsboro, OR (US); Tanay Gosavi, Portland, OR (US); Ashish Verma Penumatcha, Beaverton, OR (US); Shriram Shivaraman, Hillsboro, OR (US); Chia-Ching Lin, Portland, OR (US); Sudarat Lee, Hillsboro, OR (US); Uygar E. Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/414,290

(22) Filed: Jan. 16, 2024

(65) Prior Publication Data

US 2024/0186416 A1 Jun. 6, 2024

Related U.S. Application Data

(63) Continuation of application No. 16/913,835, filed on Jun. 26, 2020, now Pat. No. 11,935,956.

(51) Int. Cl.
*H01L 29/78* (2006.01)
*H01L 29/06* (2006.01)
(Continued)

(52) U.S. Cl.
CPC ...... *H01L 29/7853* (2013.01); *H01L 29/0673* (2013.01); *H01L 29/24* (2013.01);
(Continued)

(58) Field of Classification Search
CPC . H01L 29/7853; H01L 29/0673; H01L 29/24; H01L 29/42392; H01L 29/6653;
(Continued)

(56) References Cited

U.S. PATENT DOCUMENTS 9,754,953 B2 * 9/2017 Tang .................. H10B 41/27
10,243,054 B1 * 3/2019 Cheng ................ H01L 27/088
(Continued)

OTHER PUBLICATIONS

H. Ilatikhameneh, et al., "Tunnel Field-Effect Transistors in 2-D Transition Metal Dichalcogenide Materials," in IEEE Journal on Exploratory Solid-State Computational Devices and Circuits, vol. 1, pp. 12-18, Dec. 2015 (Year: 2015).

*Primary Examiner* — Sitaramarao S Yechuri
(74) *Attorney, Agent, or Firm* — Schwabe, Williamson & Wyatt P.C.

(57) ABSTRACT

Embodiments disclosed herein comprise semiconductor devices with two dimensional (2D) semiconductor channels and methods of forming such devices. In an embodiment, the semiconductor device comprises a source contact and a drain contact. In an embodiment, a 2D semiconductor channel is between the source contact and the drain contact. In an embodiment, the 2D semiconductor channel is a shell.

20 Claims, 17 Drawing Sheets

(51) Int. Cl.
  *H01L 29/24* (2006.01)
  *H01L 29/423* (2006.01)
  *H01L 29/66* (2006.01)
  *H01L 21/02* (2006.01)

(52) U.S. Cl.
  CPC .... *H01L 29/42392* (2013.01); *H01L 29/6653* (2013.01); *H01L 29/6681* (2013.01); *H01L 21/02568* (2013.01); *H01L 21/0262* (2013.01)

(58) Field of Classification Search
  CPC ........... H01L 29/6681; H01L 29/78696; H01L 29/66969; H01L 29/778; H01L 29/0665; H01L 29/1606; H01L 21/02568; H01L 21/0262; H01L 21/02483
  See application file for complete search history.

(56) References Cited

U.S. PATENT DOCUMENTS

| | | | |
|---|---|---|---|
| 10,461,965 B1* | 10/2019 | Contreras | H04L 25/028 |
| 2019/0287864 A1* | 9/2019 | Cheng | H01L 21/823468 |
| 2020/0006356 A1* | 1/2020 | Ando | H01L 21/02532 |
| 2021/0225862 A1* | 7/2021 | Zhang | H10B 43/27 |
| 2021/0296402 A1* | 9/2021 | Han | H10B 69/00 |

* cited by examiner

TMD INVERTED NANOWIRE INTEGRATION

CROSS-REFERENCE TO RELATED APPLICATIONS

This application is a continuation of U.S. patent application Ser. No. 16/913,835, filed on Jun. 26, 2020, the entire contents of which is hereby incorporated by reference herein.

TECHNICAL FIELD

Embodiments of the present disclosure relate to semiconductor devices, and more particularly two dimensional (2D) semiconductor devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, research into two-dimensional (2D) semiconductor devices, such as transition metal dichalcogenides (TMDs), has become more prevalent as a way to provide further scaling down of dimensions. Particularly, TMD devices allow for improved short channel effects and allow for additional scaling of transistor devices. Scaling 2D semiconductor transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

EMBODIMENTS OF THE PRESENT DISCLOSURE

Described herein are two dimensional (2D) semiconductor devices, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, 2D semiconductor materials have the potential to outperform silicon and III-V transistors for gate lengths $L_g$ below approximately 10 nm due to the decreased short channel effects. However, 2D semiconductor channels suffer from low drive current Id. Accordingly, embodiments disclosed herein include stacked 2D semiconductor channels in order to provide enhanced drive currents suitable for use in advanced semiconductor devices.

In an embodiment, transistors with stacked 2D semiconductor channels are formed using sacrificial nanowires (or nanoribbons). For example, sacrificial nanowires are formed and a gate stack is disposed over the nanowires. The nanowires are then etched out to provide a void within the gate stack. 2D semiconductor channels may then be grown from a seed material. The 2D semiconductor channels line the void. In some embodiments, the 2D semiconductor channels may be referred to as shells. The interior of the shells may be air filled, or the interiors may be filled with a dielectric.

Figure 1A:
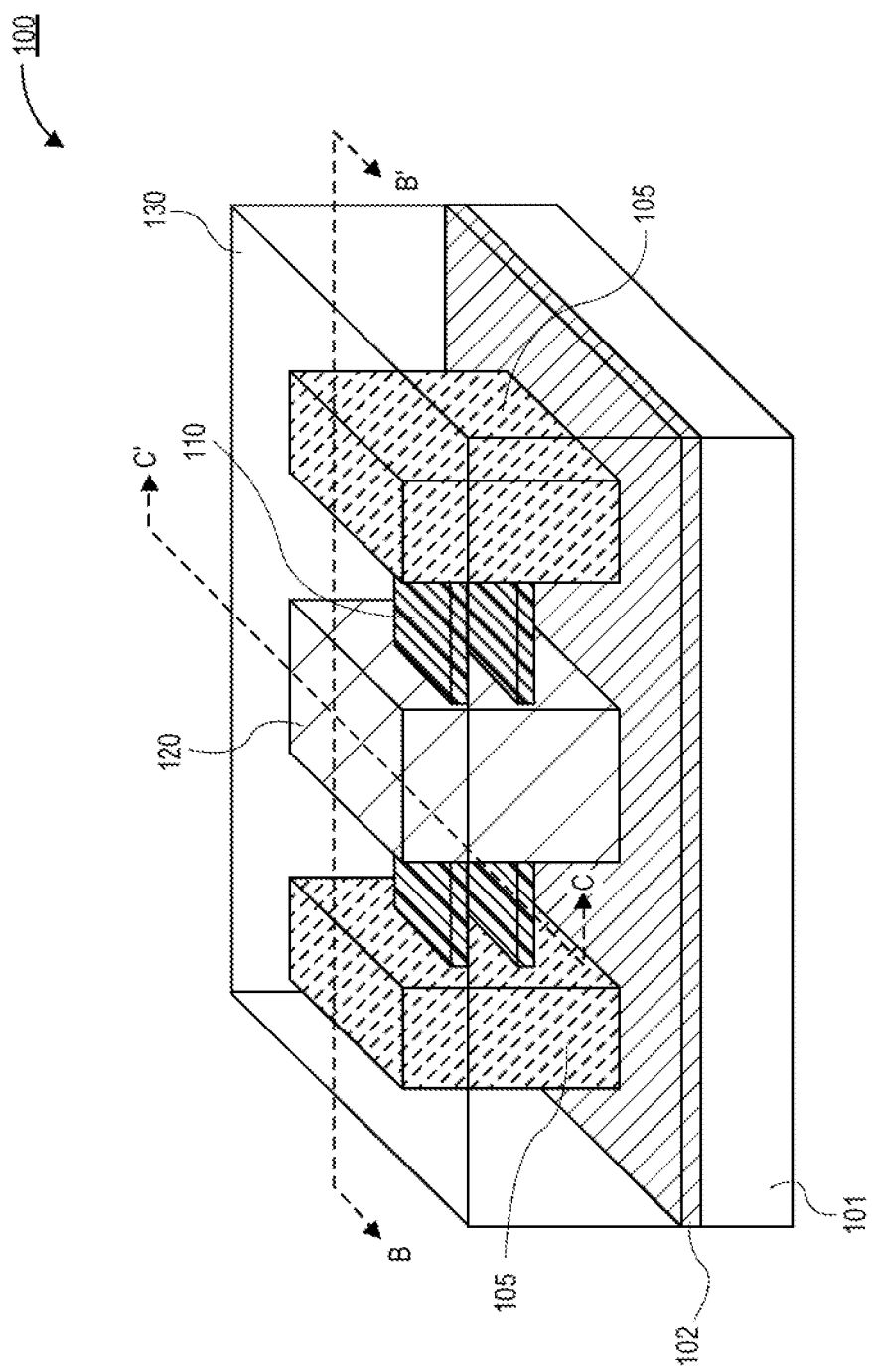
FIG. 1A is a perspective view illustration of a two dimensional (2D) semiconductor transistor, in accordance with an embodiment.

Referring now to FIG. 1A, a perspective view illustration of a transistor 100 is shown, in accordance with an embodiment. In an embodiment, the transistor 100 may be disposed over an isolation layer 102. The isolation layer 102 may be disposed over an underlying substrate 101. In an embodiment, the underlying substrate 101 represents a general workpiece object used to manufacture integrated circuits. The substrate 101 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, the transistor 100 comprises a vertical stack of 2D semiconductor channels 110. The 2D semiconductor channels 110 may comprise any suitable 2D semiconductor material. A 2D semiconductor material is a type of natural semiconductor with thicknesses on the atomic scale. For example, the 2D semiconductor material may have a thickness that is provided by a single atomic layer of the material (i.e., a monolayer of the 2D semiconductor material). In other embodiments, the 2D semiconductor channels 110 may comprise several layers of the 2D semiconductor material. In a particular embodiment, the 2D semiconductor channels 110 may comprise van der Waals 2D materials (2D materials for short). One class of 2D materials are transition metal dichalcogenides (TMDs). TMDs are a class of two-dimensional materials, which commonly have the chemical formula $MX_2$, where M represents transition metals, such as titanium, zirconium, hafnium, vanadium, niobium, tantalum, molybdenum, tungsten, technetium, rhenium, palladium, and platinum, and X represents a chalcogen, such as sulfur, selenium or tellurium. For example, TMD semiconductors may include, but are not limited to, $MoS_2$, $WS_2$, $MoSe_2$, $WSe_2$, $MoTe_2$, and $WTe_2$. It is to be appreciated that 2D materials are not limited to the TMDs. For example, 2D materials may also include indium selenide (InSe) and graphene.

In an embodiment, the 2D semiconductor channels 110 are shells. That is, the 2D semiconductor channels 110 may be tubular with an interior void (not visible in FIG. 1A). While two 2D semiconductor channels 110 are shown in FIG. 1A, it is to be appreciated that embodiments may include transistors 100 with any number of 2D semiconductor channels 110 (e.g., one or more 2D semiconductor channels 110).

The 2D semiconductor channels 110 pass through a gate stack 120. The gate stack 120 may comprise a gate dielectric over the 2D semiconductor channels 110, a workfunction metal over the gate dielectric, and a gate fill metal. In an embodiment, source/drain (S/D) contacts 105 are provided on opposite ends of the 2D semiconductor channels. The S/D contacts 105 may be any suitable conductive material, such as polysilicon, silicon nitride, silicon carbide, or various suitable metals or metal alloys, such as aluminum, tungsten, titanium, tantalum, copper, titanium nitride, or tantalum nitride, for example.

In an embodiment, a spacer material 130 may be disposed over and around components of the transistor 100. Only an outline of the spacer material 130 is provided in order to not obscure features of the transistor 100. In an embodiment, the spacer material 130 may be a material with etch selectivity to the materials used for the sacrificial nanoribbons and other components of the transistor 100. In an embodiment, the spacer 130 may comprise silicon nitride.

Figure 1B:
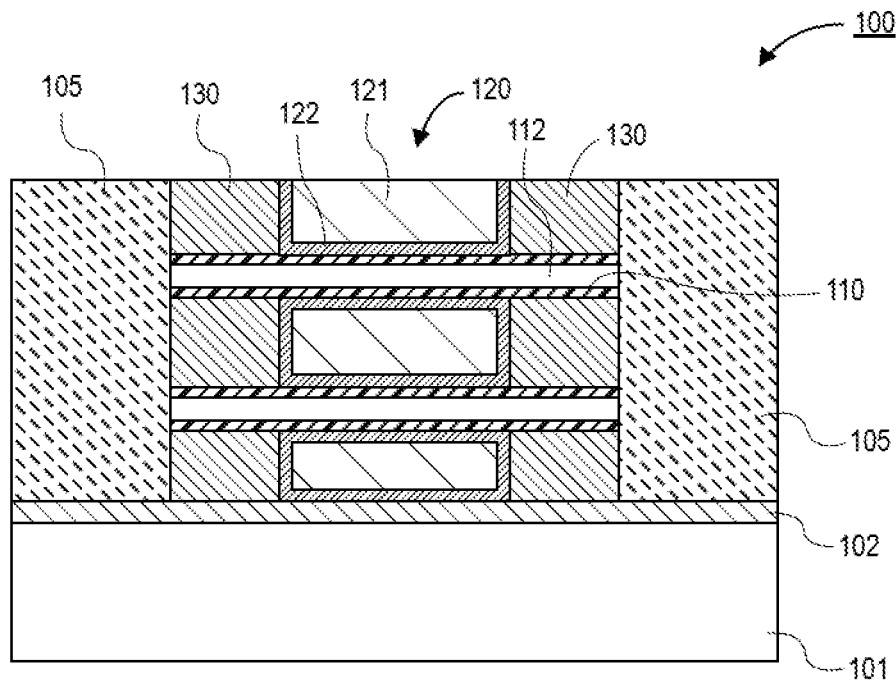
FIG. 1B is a cross-sectional illustration of the 2D semiconductor transistor in FIG. 1A along line B-B', in accordance with an embodiment.
Figure 1C:
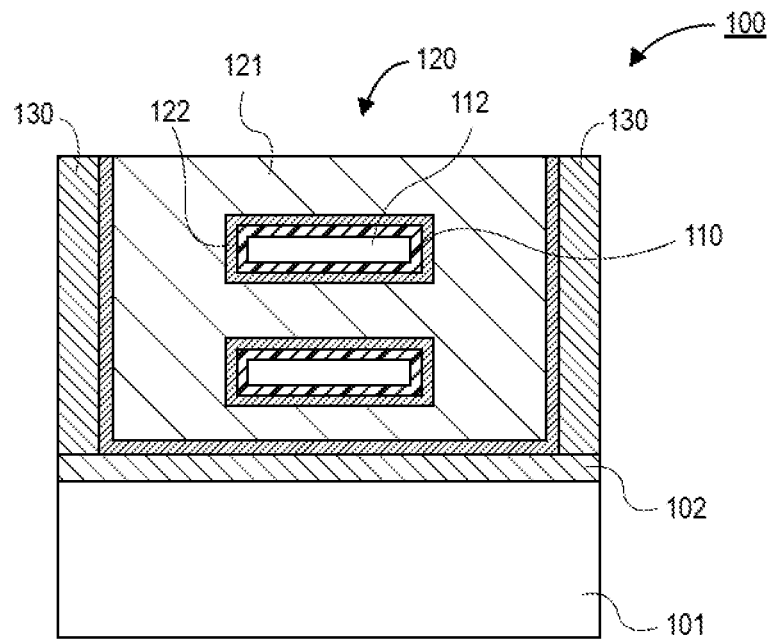
FIG. 1C is a cross-sectional illustration of the 2D semiconductor transistor in FIG. 1A along line C-C', in accordance with an embodiment.

Referring now to FIGS. 1B and 1C, cross-sectional illustrations of the transistor 100 in FIG. 1A along line B-B' and line C-C' are shown, in accordance with an embodiment. FIGS. 1B and 1C more clearly illustrates the structure of the gate stack 120 and the shell-like structure of the 2D semiconductor channels 110. As shown, the gate stack 120 comprises a gate dielectric 122 and a gate electrode 121. The gate electrode 121 is shown as a single material, but it is to be appreciated that the gate electrode 121 may comprise a workfunction metal and fill metal.

When the gate electrode 121 will serve as an N-type workfunction metal, the gate electrode 121 preferably has a workfunction that is between about 3.9 eV and about 4.2 eV. N-type materials that may be used to form the gate electrode 121 include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the gate electrode 121 will serve as a P-type workfunction metal, the gate electrode 121 preferable has a workfunction that is between about 4.9 eV and about 5.2 eV. P-type materials that may be used to form the gate electrode 121 include, but are not limited to, ruthenium, palladium, platinum, cobalt, nickel, and conductive metal oxides, e.g., ruthenium oxide.

The gate dielectric 122 is disposed around an outer surface of the 2D semiconductor channels 110 and separates the 2D semiconductor channels 110 from the gate electrode 121. The gate dielectric 122 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In an embodiment, the gate stack 120 may be separated from the S/D contacts 105 by portions of the spacer layer 130. As shown, the 2D semiconductor channels 110 pass through the gate stack 120 and the spacer layer 130. The ends of the 2D semiconductor channels 110 directly contact the S/D contacts 105.

As shown in FIG. 1C, the 2D semiconductor channel 110 comprises a shell around a void 112. In an embodiment, the void 112 is filled with air. The 2D semiconductor channel 110 may have a cross-section that is substantially rectangular. The cross-section of the 2D semiconductor channel 110 matches the perimeter of the sacrificial nanoribbons used to form the transistor 100. The process for forming the transistor 100 is described in greater detail below.

Figure 1D:
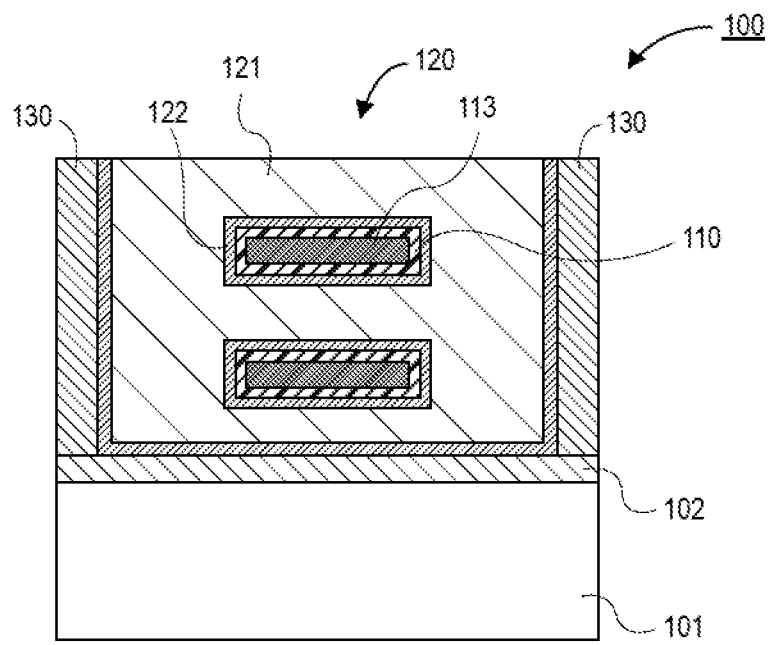
FIG. 1D is a cross-sectional illustration of a 2D semiconductor transistor with a dielectric filling the 2D semiconductor shell, in accordance with an embodiment.

Referring now to FIG. 1D, a cross-sectional illustration of a transistor 100 is shown, in accordance with an additional embodiment. The transistor 100 in FIG. 1D is substantially similar to the transistor 100 in FIG. 1C, with the exception that the void 112 is filled with a dielectric material 113. Filling the void 112 may provide additional structural support for the thin 2D semiconductor channel 110. The additional structural integrity provided by dielectric material 113 allows for a replacement of the gate stack to be implemented, if necessary.

Figure 1E:
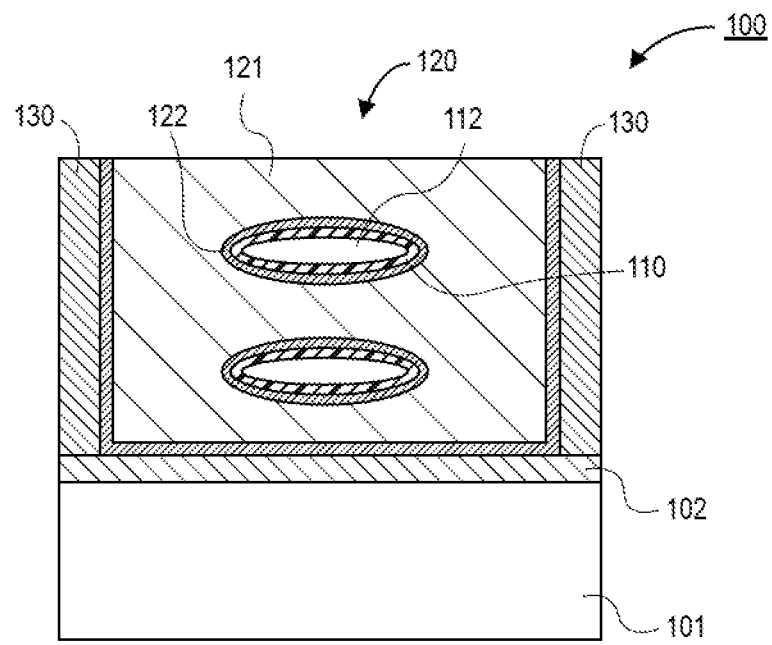
FIG. 1E is a cross-sectional illustration of a 2D semiconductor transistor with a 2D semiconductor shell that has an elliptical cross-section, in accordance with an embodiment.

Referring now to FIG. 1E, a cross-sectional illustration of a transistor 100 is shown, in accordance with an additional embodiment. The transistor 100 in FIG. 1E is substantially similar to the transistor 100 in FIG. 1C, with the exception that the 2D semiconductor channel 210 has an elliptical cross-section. In an embodiment, the cross-section of the 2D semiconductor channel 210 may also be circular. The different shape of the cross-section of the 2D semiconductor channel 210 is provided by modifying the shape of a sacrificial nanoribbon or nanowire used in the fabrication of the transistor 100.

Referring now to FIGS. 2A-7C, a series of illustrations depicting a process for forming a transistor 200 with 2D semiconductor channels is shown, in accordance with an embodiment. In each set of Figures (e.g., FIGS. 2A-2C) The first Figure (e.g., FIG. 2A) is a perspective illustration, the second Figure (e.g., FIG. 2B) is a cross-section of the first Figure along line B-B', and the third Figure (e.g., FIG. 2C) is a cross-section of the first Figure along line C-C'.

Figure 2A:
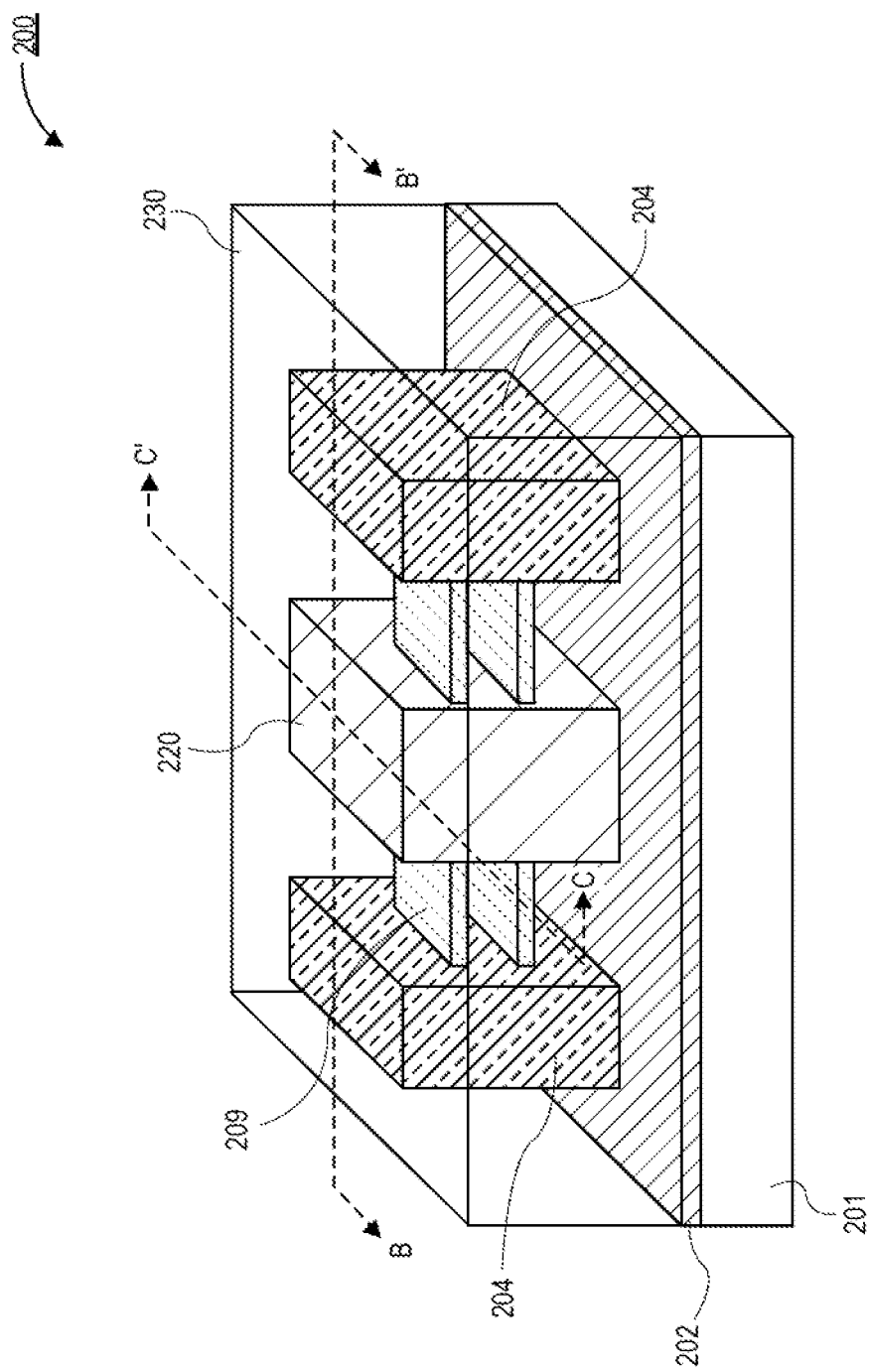
FIG. 2A is a perspective view illustration of a transistor with sacrificial nanoribbons, in accordance with an embodiment.
Figure 2B:
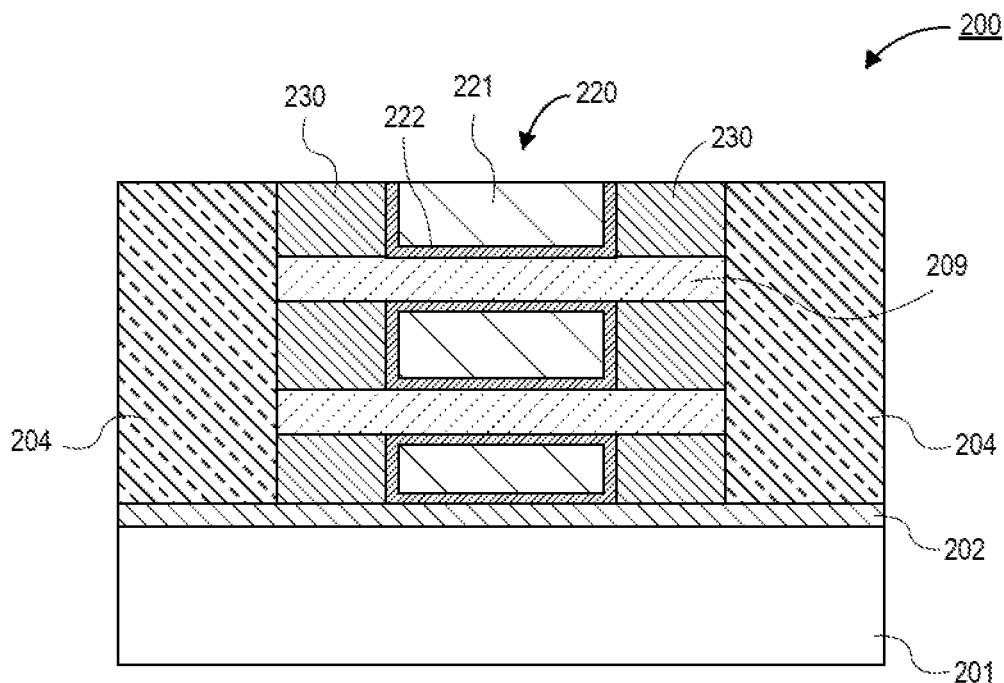
FIG. 2B is a cross-sectional illustration of the transistor in FIG. 2A along line B-B', in accordance with an embodiment.
Figure 2C:
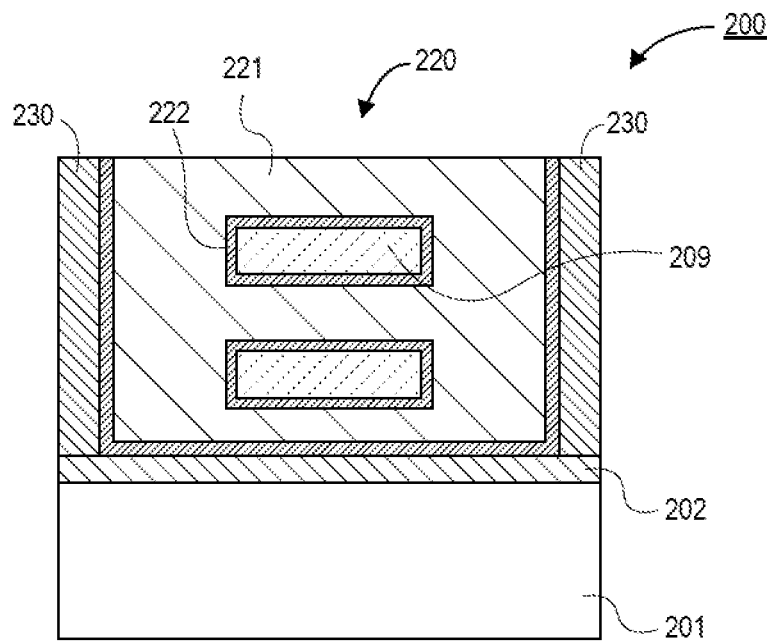
FIG. 2C is a cross-sectional illustration of the transistor in FIG. 2A along line C-C', in accordance with an embodiment.

Referring now to FIGS. 2A-2C, a perspective view illustration and cross-sectional illustrations of a transistor 200 at a stage of manufacture are shown, in accordance with an embodiment. As shown the transistor 200 is disposed over an isolation layer 202 and an underlying substrate 201. The transistor 200 comprises a stack of sacrificial nanoribbons 209 disposed between sacrificial S/D contacts 204. In the illustrated embodiment, a pair of sacrificial nanoribbons 209 are shown. However, it is to be appreciated that the transistor 200 may include any number of sacrificial nanoribbons 209 (i.e., one or more sacrificial nanoribbons 209). In an embodiment, the sacrificial nanoribbons 209 may be any suitable semiconductor material. For example, the sacrificial nanoribbons 209 may comprise silicon. While shown as rectangular nanoribbons, it is to be appreciated that the sacrificial nanoribbons 209 may be replaced with nanowires. Additionally, the sacrificial nanoribbons 209 or nanowires may have elliptical or circular cross-sections.

In an embodiment, a gate stack 220 is disposed over and around the sacrificial nanoribbons 209. The gate stack 220 may comprise a gate dielectric 222 and a gate electrode 221. Providing the gate dielectric over the sacrificial nanoribbons 209 provides integration advantages over forming the gate dielectric 222 after formation of the 2D semiconductor channels. This is because 2D semiconductor materials are Van der Waals materials and typically do not have any dangling bonds. This makes atomic layer deposition (ALD) of the gate dielectric 222 onto the 2D semiconductor material difficult.

In an embodiment, the transistor 200 may be surrounded by a spacer layer 230. The spacer layer 230 surrounds a perimeter of the sacrificial nanoribbons 209 outside of the gate stack 220. Accordingly, at this point of the processing, the sacrificial nanoribbons 209 are surrounded by material across their entire length between the sacrificial S/D contacts 204.

Figure 3A:
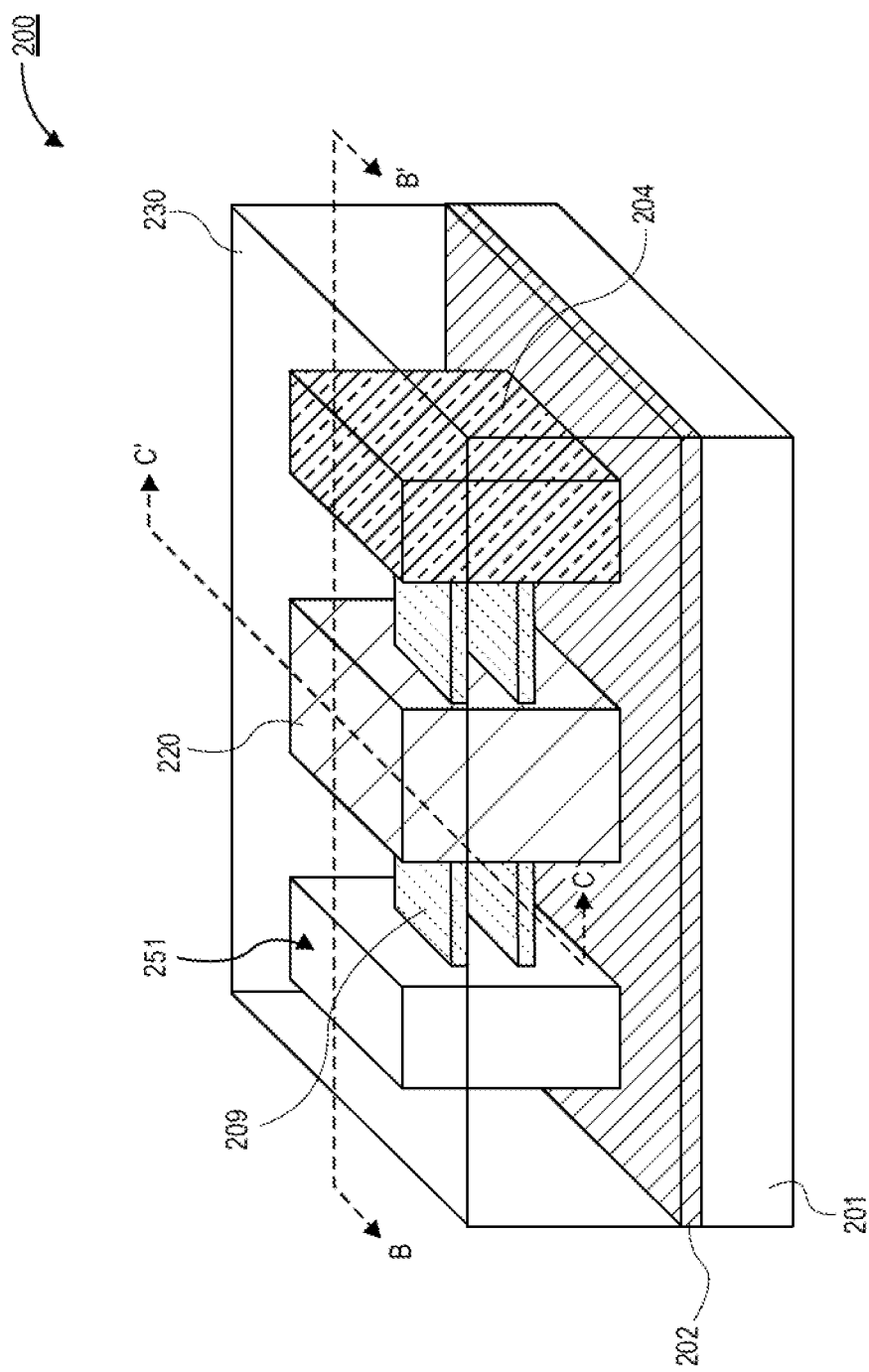
FIG. 3A is a perspective view illustration of the transistor after a sacrificial source contact is removed, in accordance with an embodiment.
Figure 3B:
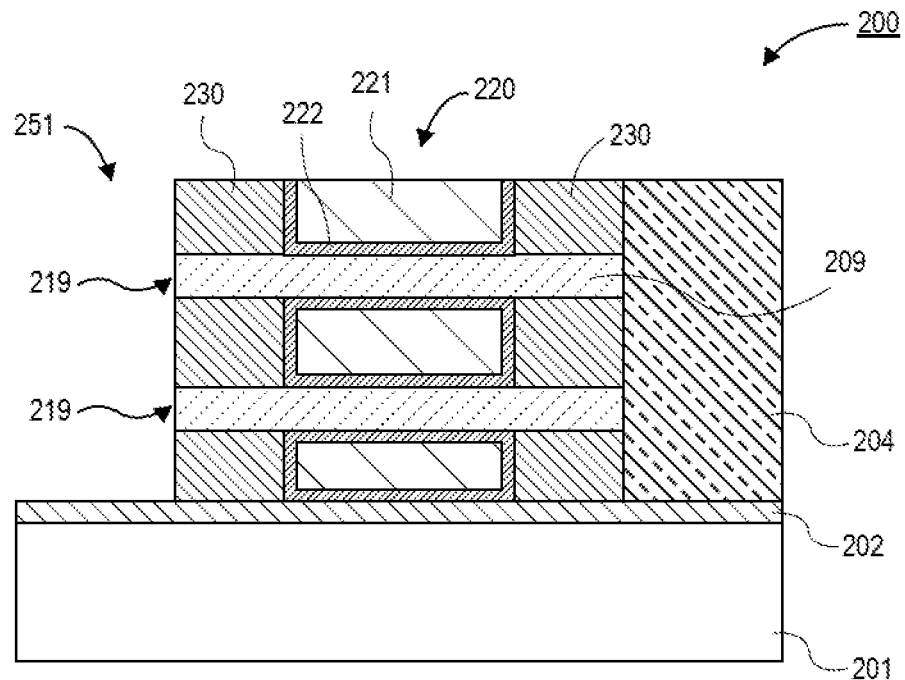
FIG. 3B is a cross-sectional illustration of the transistor in FIG. 3A along line B-B', in accordance with an embodiment.
Figure 3C:
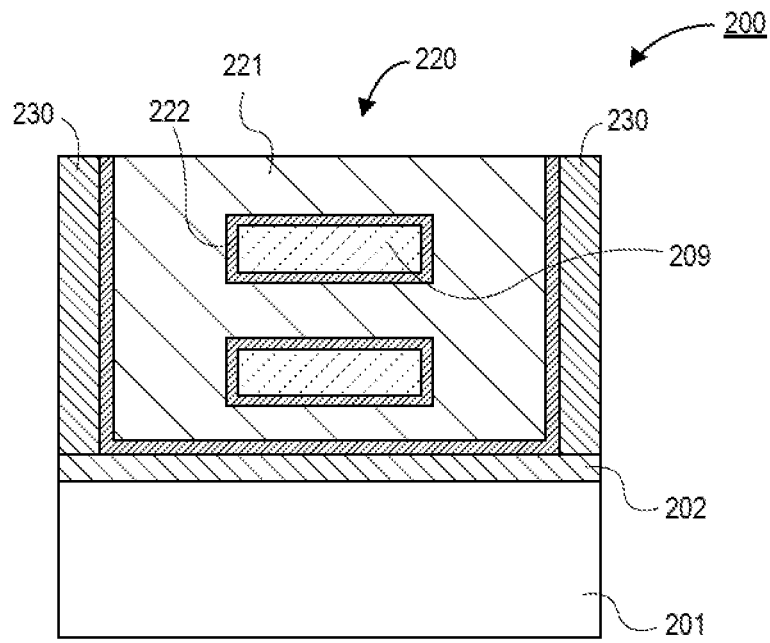
FIG. 3C is a cross-sectional illustration of the transistor in FIG. 3A along line C-C', in accordance with an embodiment.

Referring now to FIGS. 3A-3C a perspective view illustration and cross-sectional illustrations of a transistor 200 at a stage of manufacture are shown, in accordance with an embodiment. FIGS. 3A-3C illustrate the transistor 200 after one of the sacrificial S/D contacts 204 is removed. The removal of the sacrificial S/D contact 204 leaves behind an opening 251 in the spacer layer 230. The sacrificial S/D contact 204 may be removed with an etching process. For example, a wet etching chemistry that is selective to the sacrificial S/D contact 204 over the spacer layer 230 may be used. The removal of the sacrificial S/D contact 204 exposes ends 219 of the sacrificial nanoribbons 209.

Figure 4A:
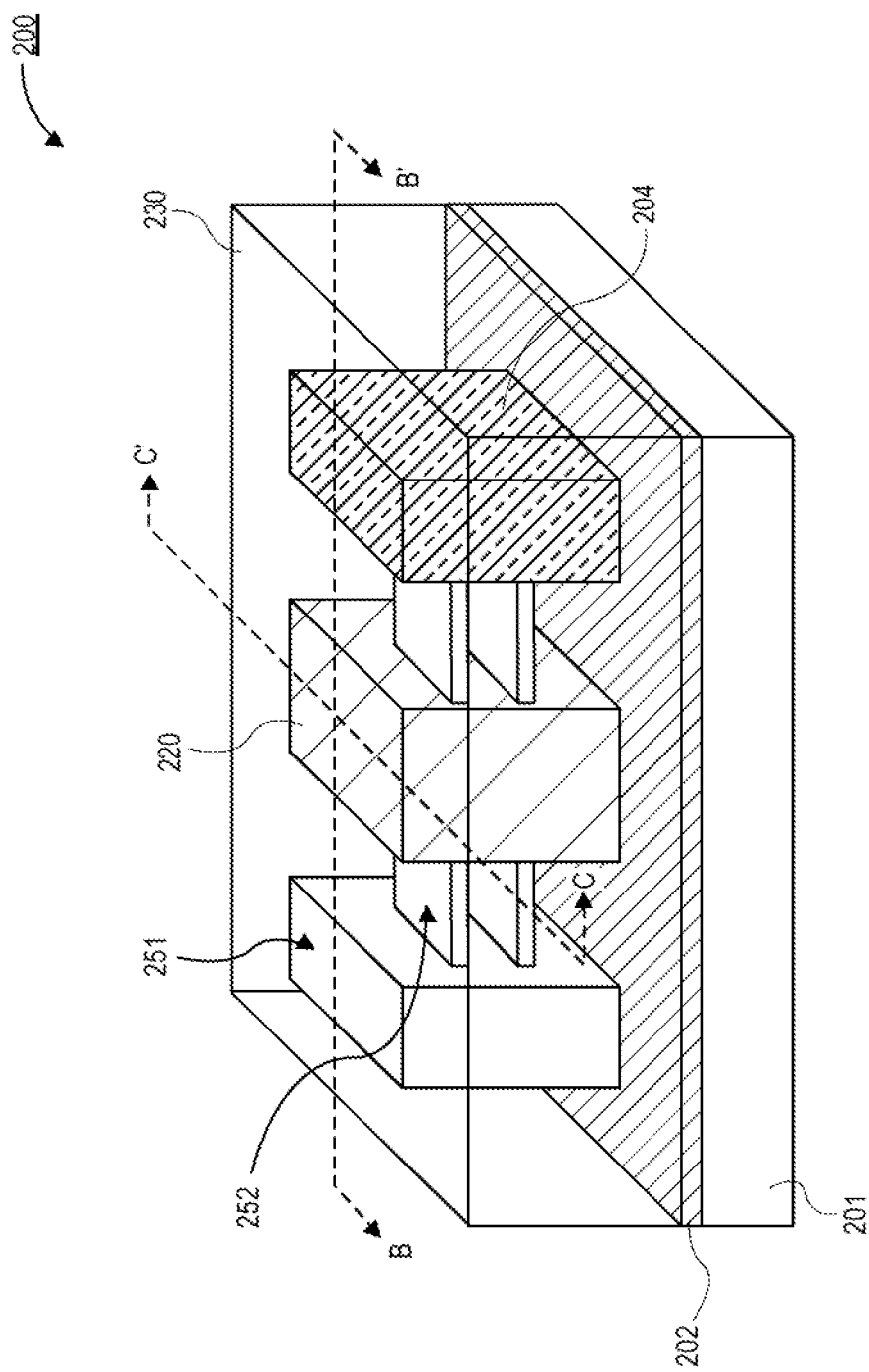
FIG. 4A is a perspective view illustration of the transistor after the sacrificial nanoribbons are removed, in accordance with an embodiment.
Figure 4B:
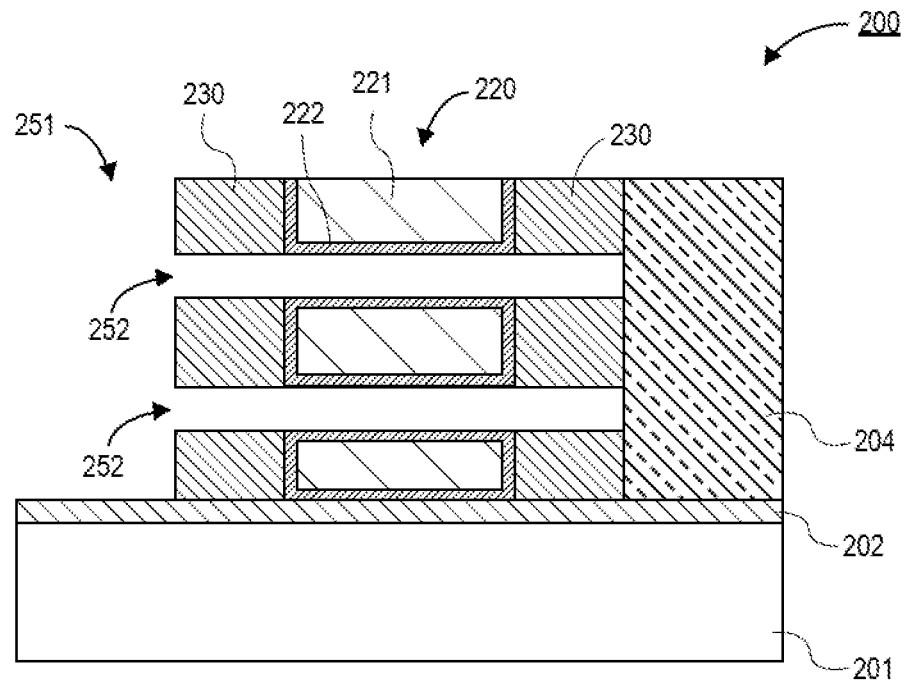
FIG. 4B is a cross-sectional illustration of the transistor in FIG. 4A along line B-B', in accordance with an embodiment.
Figure 4C:
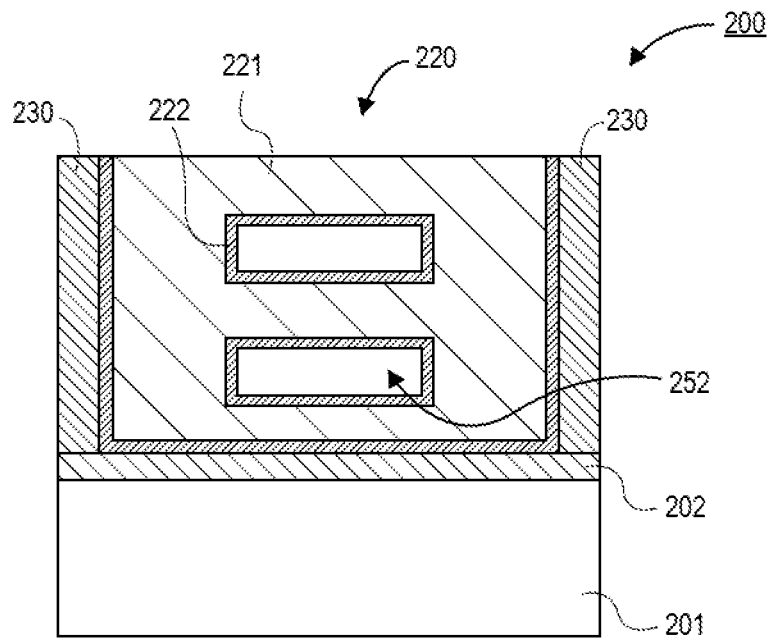
FIG. 4C is a cross-sectional illustration of the transistor in FIG. 4A along line C-C', in accordance with an embodiment.

Referring now to FIGS. 4A-4C a perspective view illustration and cross-sectional illustrations of a transistor 200 at a stage of manufacture are shown, in accordance with an embodiment. FIGS. 4A-4C illustrate the transistor 200 after the sacrificial nanoribbons 209 are removed. In an embodiment, the sacrificial nanoribbons 209 may be removed with an etching process that is selective to the sacrificial nanoribbons 209 over the spacer layer 230 and the gate dielectric 222. Removal of the sacrificial nanoribbons 209 results in the formation of a void 252 in the structure. The void 252 will have a shape substantially similar to the shape of the sacrificial nanoribbons.

Figure 5A:
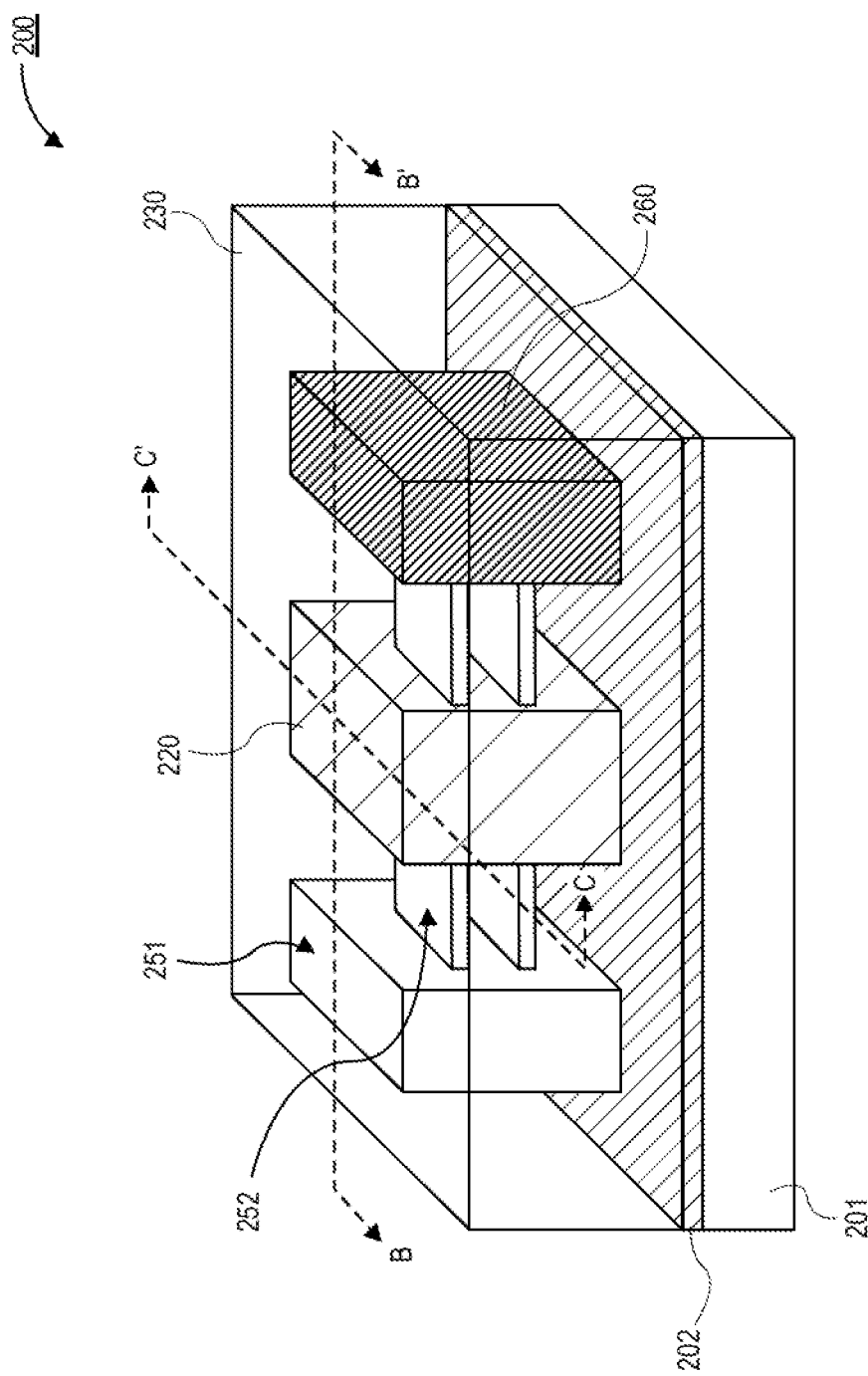
FIG. 5A is a perspective view illustration of the transistor after a sacrificial drain is replaced by a seed material, in accordance with an embodiment.
Figure 5B:
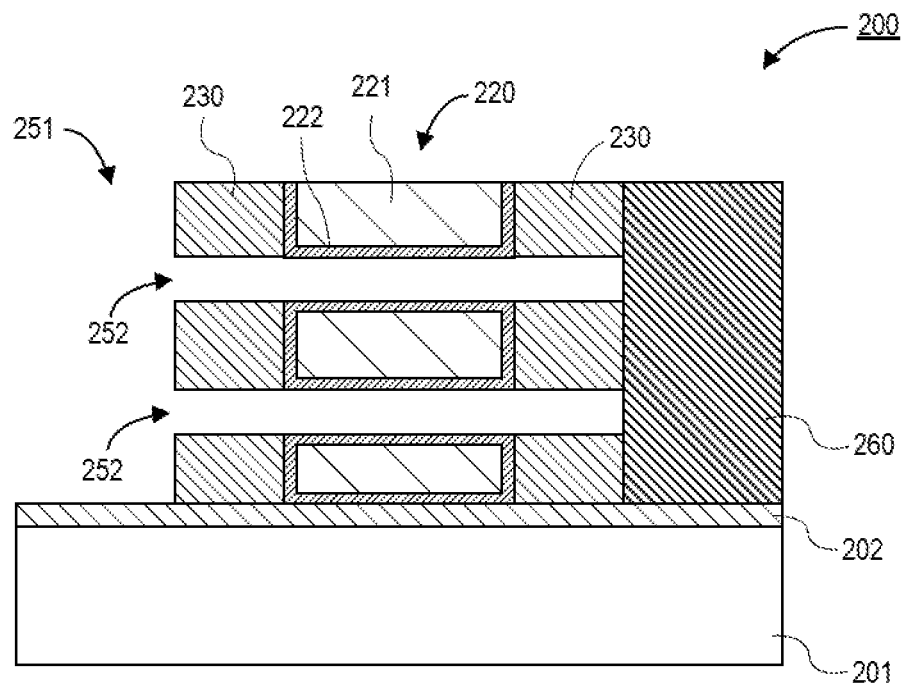
FIG. 5B is a cross-sectional illustration of the transistor in FIG. 5A along line B-B', in accordance with an embodiment.
Figure 5C:
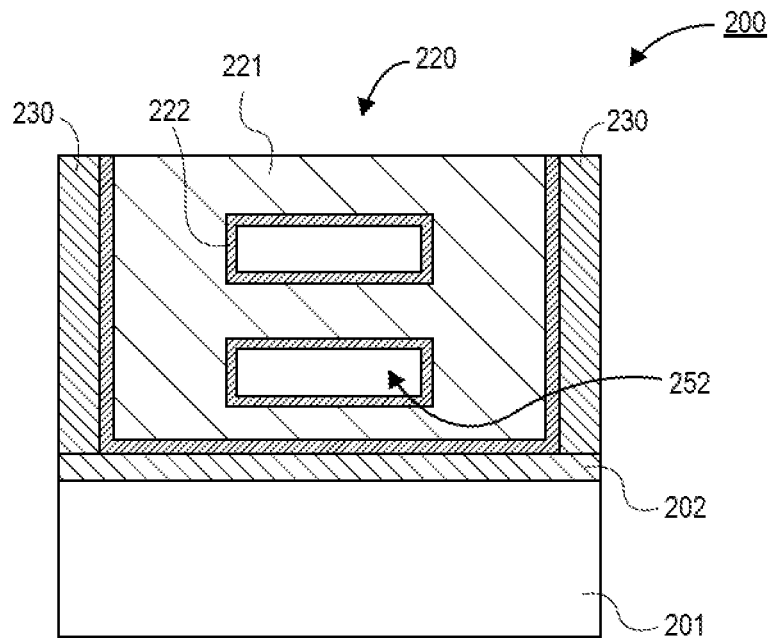
FIG. 5C is a cross-sectional illustration of the transistor in FIG. 5A along line C-C', in accordance with an embodiment.

Referring now to FIGS. 5A-5C a perspective view illustration and cross-sectional illustrations of a transistor 200 at a stage of manufacture are shown, in accordance with an embodiment. FIGS. 5A-5C illustrate the transistor 200 after the remaining sacrificial S/D contact 204 is replaced with a seed material 260. The sacrificial S/D contact 204 may be removed with a wet etching process. In an embodiment, the seed material 260 is a material used to grow the 2D semiconductor channels. For example, the seed material may comprise tungsten oxide ($WO_3$) or molybdenum oxide ($MoO_3$). While listed as $MO_3$ materials, it is to be appreciated that the stoichiometric value of oxygen may not necessarily be 3. For example, oxygen content may have a stoichiometric value lower than two or higher than three. Additionally, material systems may not always allow for a stoichiometric value of 3. For example, to make an $HfS_2$ the seed material may comprise $HfO_2$ since it is difficult to form $HfO_3$.

Figure 6A:
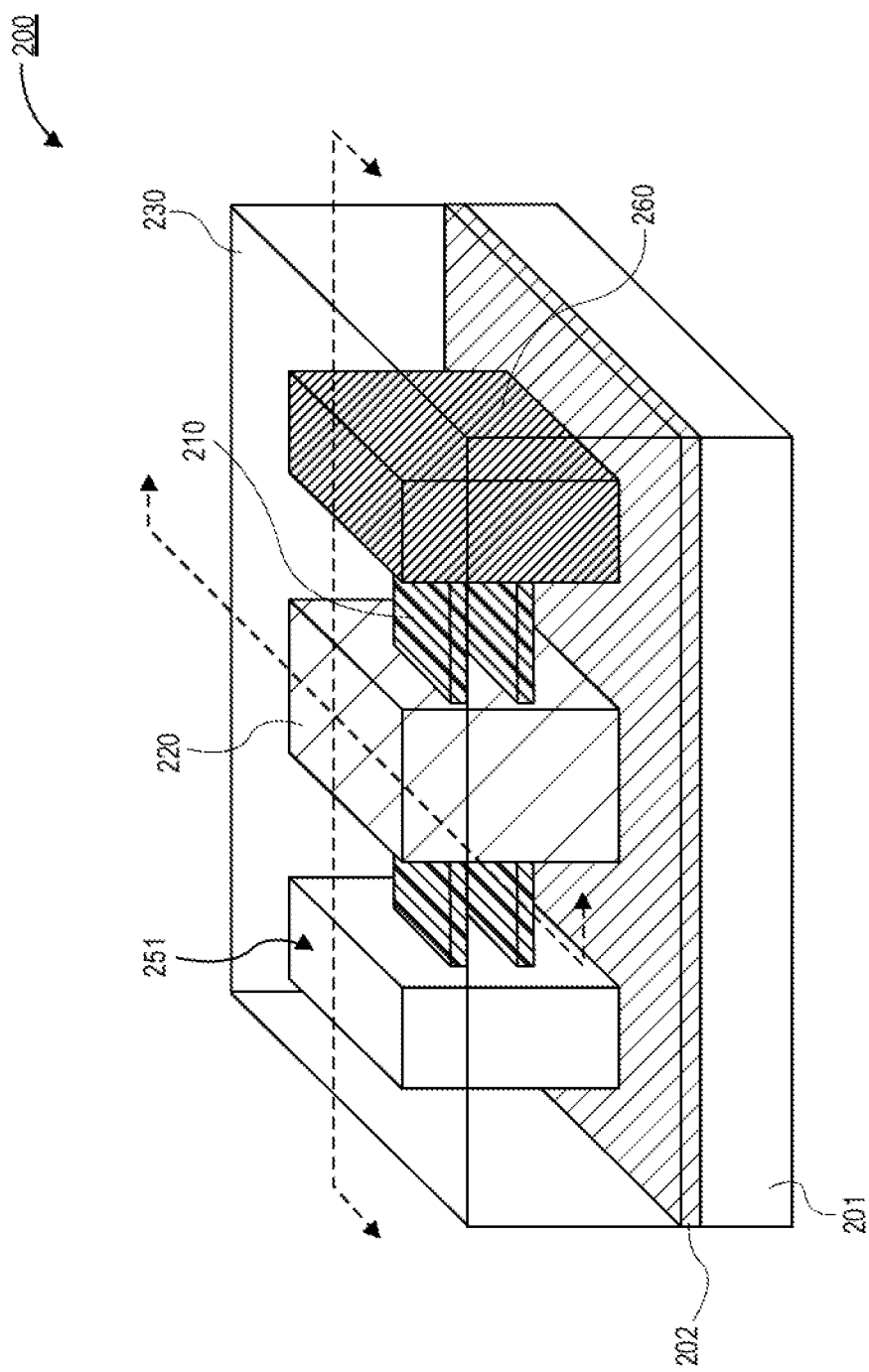
FIG. 6A is a perspective view illustration of the transistor after 2D semiconductor shells are grown in the voids formed by the removal of the sacrificial nanoribbons, in accordance with an embodiment.
Figure 6B:
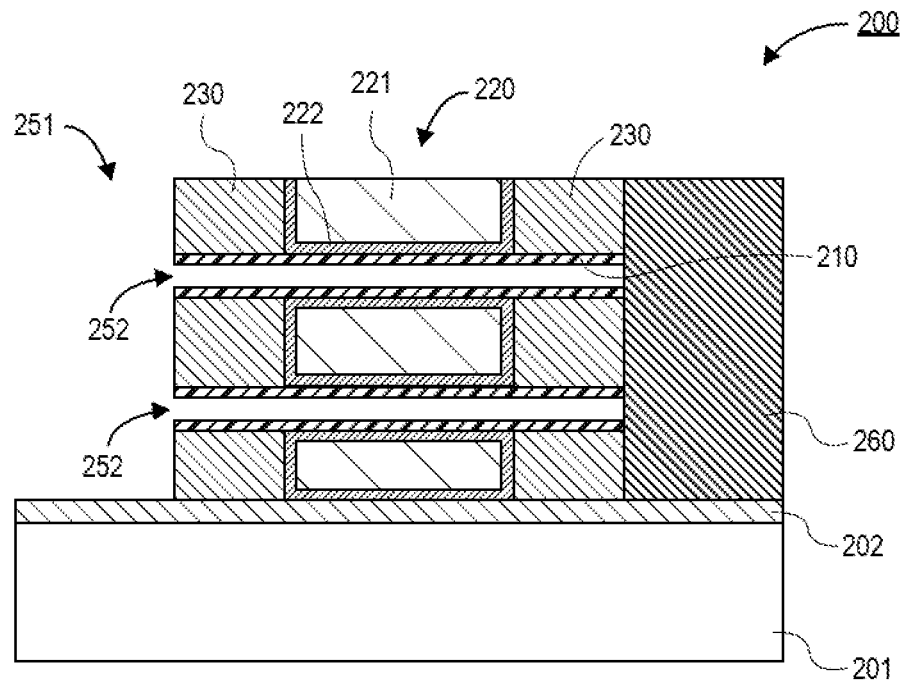
FIG. 6B is a cross-sectional illustration of the transistor in FIG. 6A along line B-B', in accordance with an embodiment.
Figure 6C:
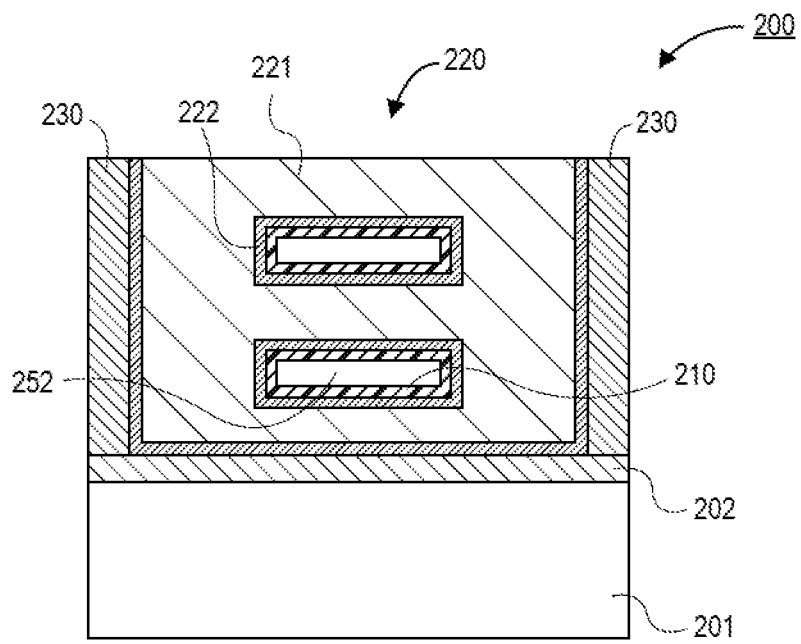
FIG. 6C is a cross-sectional illustration of the transistor in FIG. 6A along line C-C', in accordance with an embodiment.

Referring now to FIGS. 6A-6C a perspective view illustration and cross-sectional illustrations of a transistor 200 at a stage of manufacture are shown, in accordance with an embodiment. FIGS. 6A-6C illustrate the transistor 200 after the growth of the 2D semiconductor channels 210. In an embodiment, the 2D semiconductor channels 210 may comprise any suitable 2D semiconductor material. In a particular embodiment, the 2D semiconductor channels 110 may comprise TMD semiconductors, such as, but not limited to, $MoS_2$, $WS_2$, $MoSe_2$, $WSe_2$, $MoTe_2$, and $WTe_2$. It is to be appreciated that 2D materials are not limited to the TMDs. For example, 2D materials may also include indium selenide (InSe) and graphene.

In an embodiment, the 2D semiconductor channels 210 may have a thickness that is provided by a single atomic layer of the material (i.e., a monolayer of the 2D semiconductor material). In other embodiments, the 2D semiconductor channels 210 may comprise several layers of the 2D semiconductor material.

In an embodiment, the 2D semiconductor channels 210 may be grown with a high temperature exposure to a source gas. In an embodiment, a high temperature exposure may refer to a temperature between approximately 500° C. and approximately 1,000° C. For example, the 2D semiconductor material may have a thickness that is provided by a single atomic layer of the material (i.e., a monolayer of the 2D semiconductor material). In other embodiments, the 2D semiconductor channels 110 may comprise several layers of the 2D semiconductor material. For example, to provide a MoSe$_2$ 2D semiconductor channel 210, the seed material 260 may be MoO$_3$ and the source gas may comprise H$_2$Se or Se vapor. Using such a process, the 2D semiconductor channel 210 nucleates from the seed material 260 and grows laterally along the surface of the voids 252. Accordingly, the 2D semiconductor channel 210 is grown as a shell around the voids 252.

In some embodiments, after the formation of the 2D semiconductor channel 210, the remaining volume of the voids 252 may be filled with a dielectric material. Filling the voids will result in a transistor 200 similar to the transistor shown in FIG. 1D above. However, the process flow going forward omits the inclusion of a dielectric core.

Figure 7A:
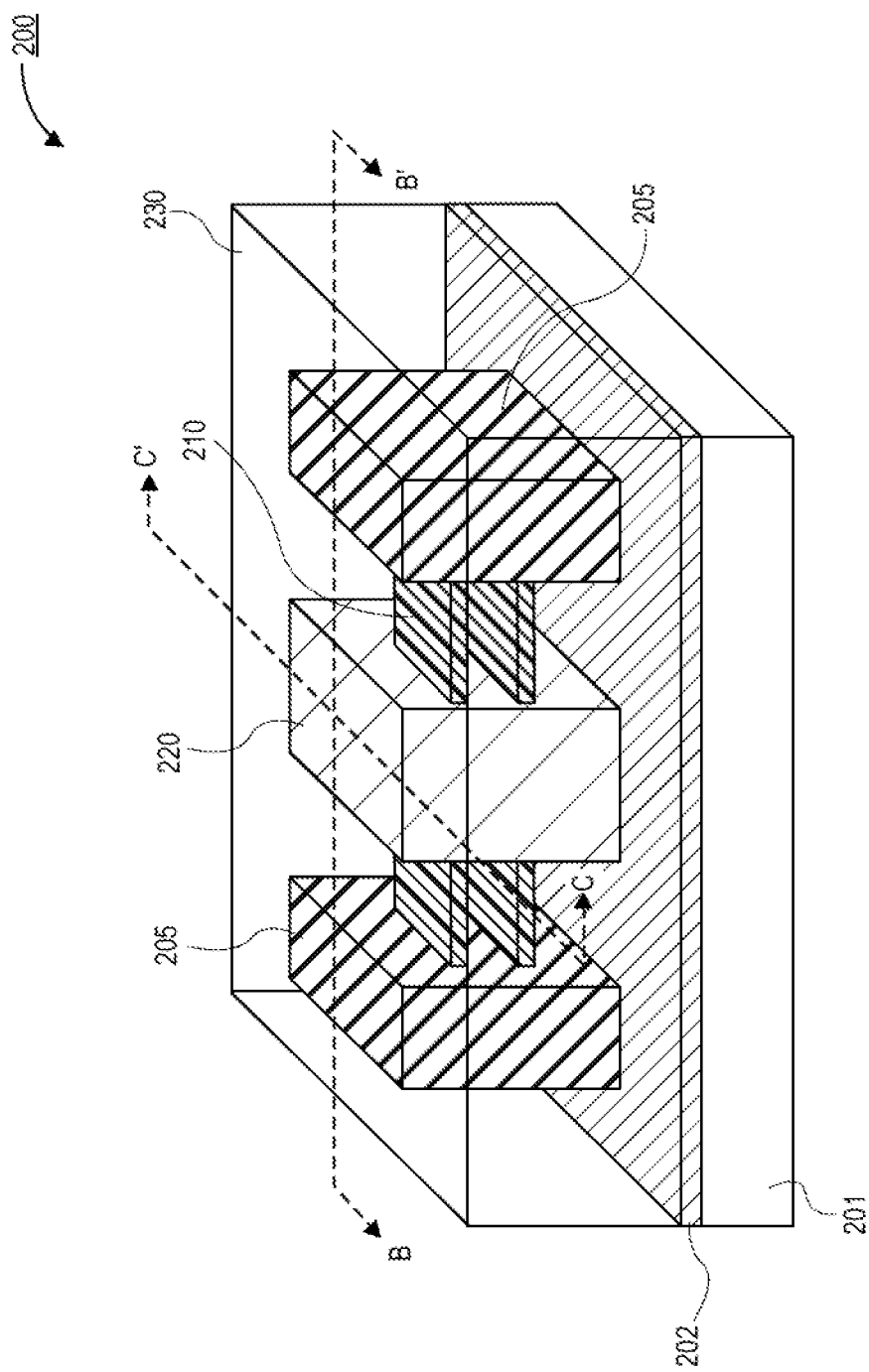
FIG. 7A is a perspective view illustration of the transistor after source/drain (S/D) contacts are provided on opposite ends of the 2D semiconductor shells, in accordance with an embodiment.
Figure 7B:
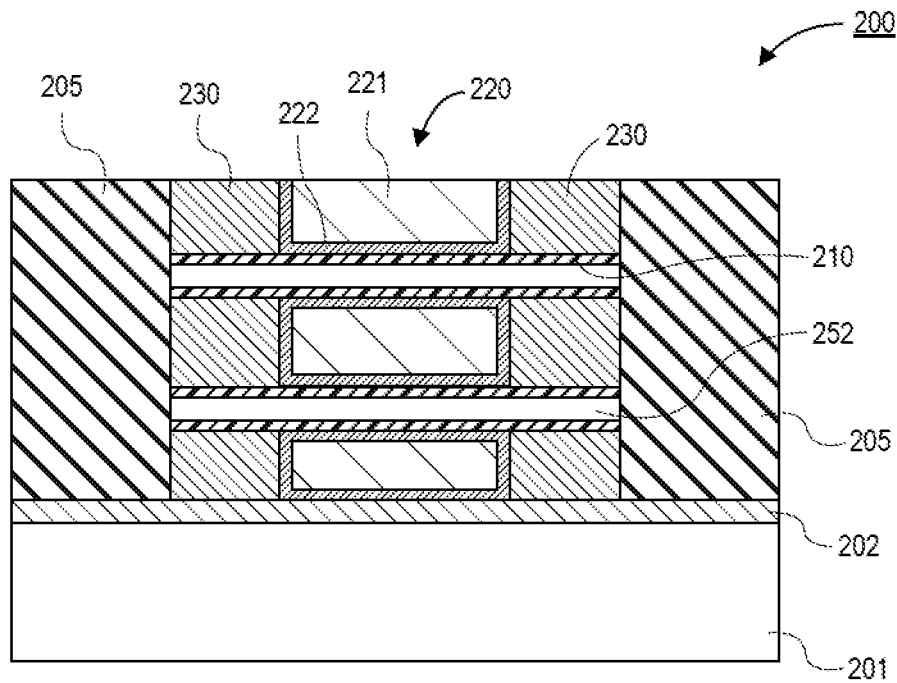
FIG. 7B is a cross-sectional illustration of the transistor in FIG. 7A along line B-B', in accordance with an embodiment.
Figure 7C:
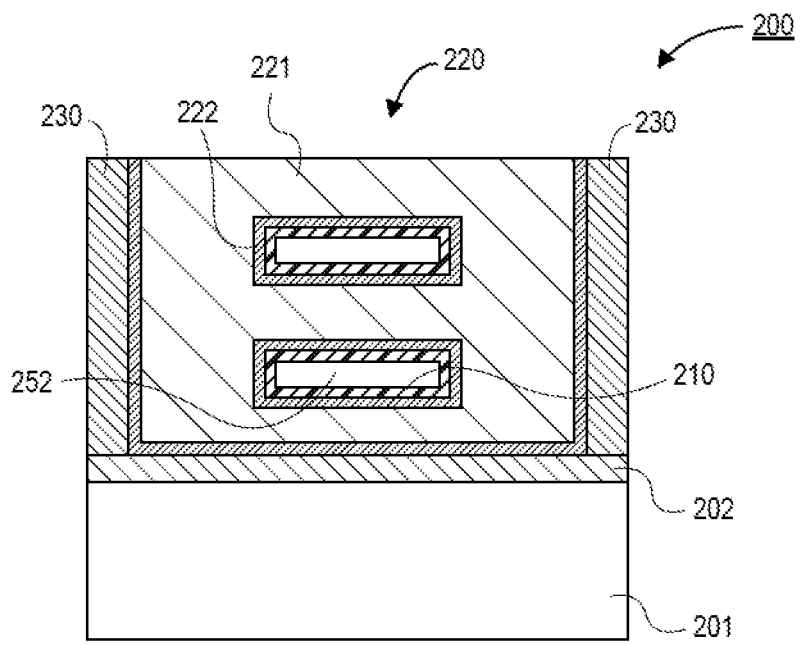
FIG. 7C is a cross-sectional illustration of the transistor in FIG. 7A along line C-C', in accordance with an embodiment.

Referring now to FIGS. 7A-7C a perspective view illustration and cross-sectional illustrations of a transistor 200 at a stage of manufacture are shown, in accordance with an embodiment. FIGS. 7A-7C are illustrations of the transistor 200 after replacement S/D contacts 205 are formed on opposite ends of the 2D semiconductor channels 210. In an embodiment, the seed material is first removed with an etching process (e.g., a wet etching process). The conductive material of the replacement S/D contacts 205 may then be deposited in the openings in the spacer layer 230 that were originally occupied by the sacrificial S/D contacts 204. In an embodiment, the replacement S/D contacts 205 may both be the same material. In other embodiments, the replacement S/D contacts 205 may be different from each other.

Figure 8:
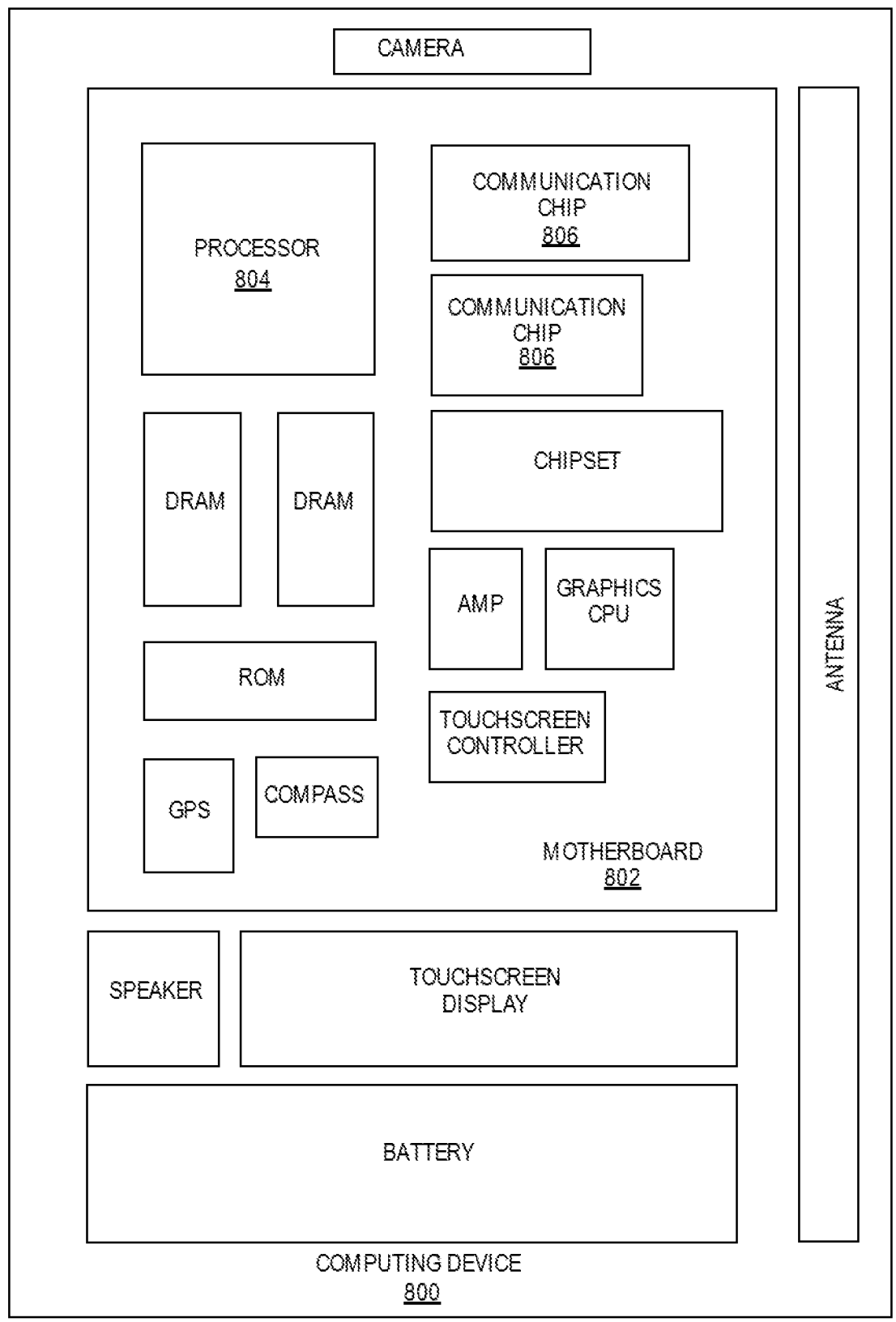
FIG. 8 illustrates a computing device in accordance with one implementation of an embodiment of the disclosure.

FIG. 8 illustrates a computing device 800 in accordance with one implementation of an embodiment of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In an embodiment, the integrated circuit die of the processor may comprise a transistor with a 2D semiconductor shell, such as those described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In an embodiment, the integrated circuit die of the communication chip may comprise a transistor with a 2D semiconductor shell, such as those described herein.

In further implementations, another component housed within the computing device 800 may comprise a transistor with a 2D semiconductor shell, such as those described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
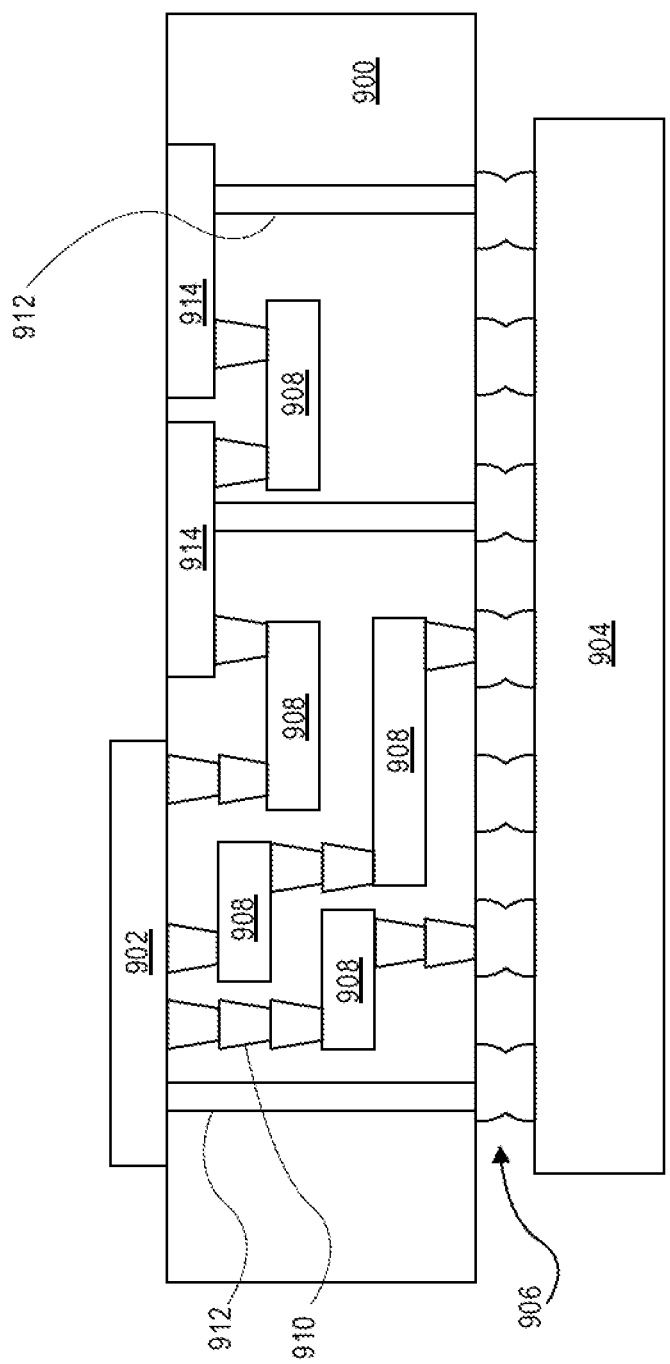
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. In an embodiment, one of both of the first substrate 902 and the second substrate 904 may comprise a transistor with a 2D semiconductor shell, in accordance with embodiments described herein. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900.

Thus, embodiments of the present disclosure may comprise a transistor with a 2D semiconductor shell, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a source contact; a drain contact; and a two dimensional (2D) semiconductor channel between the source contact and the drain contact, wherein the 2D semiconductor channel is a shell.

Example 2: the semiconductor device of Example 1, wherein an interior of the shell is filled with air.

Example 3: the semiconductor device of Example 1, wherein an interior of the shell is filled with a dielectric material.

Example 4: the semiconductor device of Examples 1-3, further comprising: a gate dielectric over an exterior surface of the shell.

Example 5: the semiconductor device of Example 4, further comprising: a gate electrode over the gate dielectric.

Example 6: the semiconductor device of Examples 1-5, wherein the 2D semiconductor channel comprises a transition metal dichalcogenide (TMD).

Example 7: the semiconductor device of Example 6, wherein the TMD comprises molybdenum and sulfur, tungsten and sulfur, molybdenum and selenium, tungsten and selenium, molybdenum and tellurium, or tungsten and tellurium.

Example 8: the semiconductor device of Examples 1-7, wherein the shell has a rectangular cross-section.

Example 9: the semiconductor device of Example 1-8, further comprising: a spacer, wherein the shell passes through the spacer.

Example 10: a method of forming a semiconductor device, comprising:
forming a stack of sacrificial channels between a sacrificial source contact and a sacrificial drain contact, wherein the sacrificial channels are surrounded by a gate stack;
removing the sacrificial source contact to expose a first end of the sacrificial channels; removing the sacrificial channels to form voids in the gate stack; replacing the sacrificial drain contact with a seed material; growing two dimensional (2D) semiconductors from the seed material into the voids, wherein the 2D semiconductors form shells lining the voids; removing the seed material; and disposing a replacement source contact and a replacement drain contact at opposite ends of the shells.

Example 11: the method of Example 10, wherein the gate stack comprises a gate dielectric and a gate electrode.

Example 12: the method of Example 11, wherein an exterior surface of the shells are in direct contact with the gate dielectric.

Example 13: the method of Examples 10-12 further comprising: filling interiors of the shells with a dielectric material.

Example 14: the method of Examples 10-13, wherein the 2D semiconductors are a transition metal dichalcogenide (TMD).

Example 15: the method of Example 14, wherein the TMD comprises molybdenum and sulfur, tungsten and sulfur, molybdenum and selenium, tungsten and selenium, molybdenum and tellurium, or tungsten and tellurium.

Example 16: the method of Examples 10-15, wherein the seed material comprises molybdenum and oxygen or tungsten and oxygen.

Example 17: the method of Examples 10-16, wherein the 2D semiconductors are grown with a high temperature exposure in a gas comprising selenium, or hydrogen and selenium.

Example 18: an electronic system, comprising: a board; an electronic package coupled to the board; and a die coupled to the electronic package, wherein the die comprises: a transistor, wherein a channel of the transistor comprises a shell of two dimensional (2D) semiconductor material.

Example 19: the electronic system of Example 18, wherein a gate dielectric and a gate electrode surround an exterior surface of the shell.

Example 20: the electronic system of Example 18 or Example 19, wherein the 2D semiconductor material is a transition metal dichalcogenide (TMD) comprising molybdenum and sulfur, tungsten and sulfur, molybdenum and selenium, tungsten and selenium, molybdenum and tellurium, or tungsten and tellurium.

What is claimed is:

1. A semiconductor device, comprising:
a source contact;
a drain contact laterally spaced apart from the source contact; and
a semiconductor channel material layer laterally between the source contact and the drain contact, wherein the semiconductor channel material layer has a void therein in a channel region of the semiconductor channel material layer, and wherein the semiconductor channel material is above a top of the void, along sides of the void, and beneath a bottom of the void.

2. The semiconductor device of claim 1, wherein void is filled with air.

3. The semiconductor device of claim 1, wherein the void is filled with a dielectric material.

4. The semiconductor device of claim 1, further comprising:
a gate dielectric over an exterior surface of the channel region of the semiconductor channel material layer.

5. The semiconductor device of claim 4, further comprising:
a gate electrode over the gate dielectric.

6. The semiconductor device of claim 1, wherein the semiconductor channel material layer comprises a transition metal dichalcogenide (TMD).

7. The semiconductor device of claim 6, wherein the TMD comprises molybdenum and sulfur, tungsten and sulfur, molybdenum and selenium, tungsten and selenium, molybdenum and tellurium, or tungsten and tellurium.

8. The semiconductor device of claim 1, wherein the semiconductor channel material layer has a rectangular cross-section.

9. The semiconductor device of claim 1, further comprising:
a spacer, wherein the semiconductor channel material layer passes through the spacer.

10. A method of forming a semiconductor device, comprising:
forming a stack of sacrificial channels between a sacrificial source contact and a sacrificial drain contact, wherein the sacrificial channels are surrounded by a gate stack;
removing the sacrificial source contact to expose a first end of the sacrificial channels;
removing the sacrificial channels;
replacing the sacrificial drain contact with a seed material;
growing a semiconductor channel material layer from the seed material, wherein the semiconductor channel material layer has a void therein in a channel region of the semiconductor channel material layer;
removing the seed material; and
disposing a replacement source contact and a replacement drain contact at opposite ends of the shells.

11. The method of claim 10, wherein the gate stack comprises a gate dielectric and a gate electrode.

12. The method of claim 11, wherein an exterior surface of the semiconductor channel material layer is in direct contact with the gate dielectric.

13. The method of claim 10, further comprising:
filling the void with a dielectric material.

14. The method of claim 10, wherein the semiconductor channel material layer comprises a transition metal dichalcogenide (TMD).

15. The method of claim 14, wherein the TMD comprises molybdenum and sulfur, tungsten and sulfur, molybdenum and selenium, tungsten and selenium, molybdenum and tellurium, or tungsten and tellurium.

16. The method of claim 10, wherein the seed material comprises molybdenum and oxygen or tungsten and oxygen.

17. The method of claim 10, wherein the semiconductor channel material layer is grown with a high temperature exposure in a gas comprising selenium, or hydrogen and selenium.

18. An electronic system, comprising:
a board;
an electronic package coupled to the board; and
a die coupled to the electronic package, wherein the die comprises:
a transistor, wherein a channel of the transistor comprises a semiconductor channel material layer having a void therein, wherein the semiconductor channel material is above a top of the void, along sides of the void, and beneath a bottom of the void, the semiconductor channel material layer laterally between a source contact and a drain contact, the drain contact laterally spaced apart from the source contact.

19. The electronic system of claim 18, wherein a gate dielectric and a gate electrode surround an exterior surface of the semiconductor channel material layer.

20. The electronic system of claim 18, wherein the semiconductor channel material layer comprises a transition metal dichalcogenide (TMD) comprising molybdenum and sulfur, tungsten and sulfur, molybdenum and selenium, tungsten and selenium, molybdenum and tellurium, or tungsten and tellurium.

* * * * *